United States Patent
Votruba et al.

(10) Patent No.: US 7,466,130 B1
(45) Date of Patent: Dec. 16, 2008

(54) PHASED ARRAY SHOULDER COIL

(75) Inventors: Jan Votruba, Bernardston, MA (US); Charles A. Green, Holbrook, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 11/701,523

(22) Filed: Jan. 31, 2007

Related U.S. Application Data

(60) Provisional application No. 60/764,884, filed on Feb. 3, 2006.

(51) Int. Cl.
*G01V 3/00* (2006.01)

(52) U.S. Cl. ........................ 324/318; 324/309

(58) Field of Classification Search ......... 324/300–322; 600/407–455
See application file for complete search history.

(56) References Cited

U.S. PATENT DOCUMENTS

| | | | |
|---|---|---|---|
| 4,866,387 A | 9/1989 | Hyde et al. | |
| 4,918,388 A | 4/1990 | Mehdizadeh et al. | |
| 4,920,318 A | 4/1990 | Misic et al. | |
| 5,030,915 A | 7/1991 | Boskamp et al. | |
| 5,050,605 A | 9/1991 | Eydelman et al. | |
| 5,081,665 A | 1/1992 | Kostich | |
| 5,221,902 A | 6/1993 | Jones et al. | |
| 5,256,971 A | 10/1993 | Boskamp | |
| 5,274,332 A | 12/1993 | Jaskolski et al. | |
| 5,349,956 A | 9/1994 | Bonutti | |
| 5,394,087 A | 2/1995 | Molyneaux | |
| 5,471,142 A | 11/1995 | Wang et al. | |
| 5,473,251 A | 12/1995 | Mori et al. | |
| 5,477,146 A | 12/1995 | Jones | |
| 5,548,218 A | 8/1996 | Lu | |
| 5,621,323 A | 4/1997 | Larsen | |
| 5,664,568 A * | 9/1997 | Srinivasan et al. | 600/422 |
| 5,680,861 A | 10/1997 | Rohling | |
| 5,951,474 A | 9/1999 | Matsunaga et al. | |
| 6,008,649 A | 12/1999 | Boskamp et al. | |
| 6,137,291 A | 10/2000 | Szumowski et al. | |
| 6,356,081 B1 * | 3/2002 | Misic | 324/318 |
| 6,377,044 B1 | 4/2002 | Burl et al. | |
| 6,414,490 B1 | 7/2002 | Damadian et al. | |
| 6,498,489 B1 * | 12/2002 | Vij | 324/322 |
| 6,591,128 B1 * | 7/2003 | Wu et al. | 600/422 |
| 6,677,753 B1 | 1/2004 | Danby et al. | |
| 6,850,206 B2 * | 2/2005 | Heid et al. | 343/787 |
| 6,937,016 B2 * | 8/2005 | Wang | 324/318 |
| 6,980,002 B1 | 12/2005 | Petropoulos et al. | |
| 7,245,127 B2 | 7/2007 | Feng et al. | |
| 2002/0196021 A1 | 12/2002 | Wang | |
| 2003/0210049 A1 * | 11/2003 | Boskamp et al. | 324/311 |
| 2004/0030238 A1 * | 2/2004 | Vaughan | 600/418 |
| 2004/0257079 A1 * | 12/2004 | Dumoulin et al. | 324/318 |

* cited by examiner

*Primary Examiner*—Brij B Shrivastav
(74) *Attorney, Agent, or Firm*—Lerner, David, Littenberg, Krumholz & Mentlik, LLP

(57) ABSTRACT

An antenna assembly for magnet resonance imaging comprising a housing having an inner surface, an outer surface and defining an inner annular space, the inner surface being adapted to receive a shoulder of a patient. The antenna assembly further includes a pair of coils housed within the inner annular space of the housing and arranged to form a phased array antenna for receiving resonance signals.

23 Claims, 8 Drawing Sheets

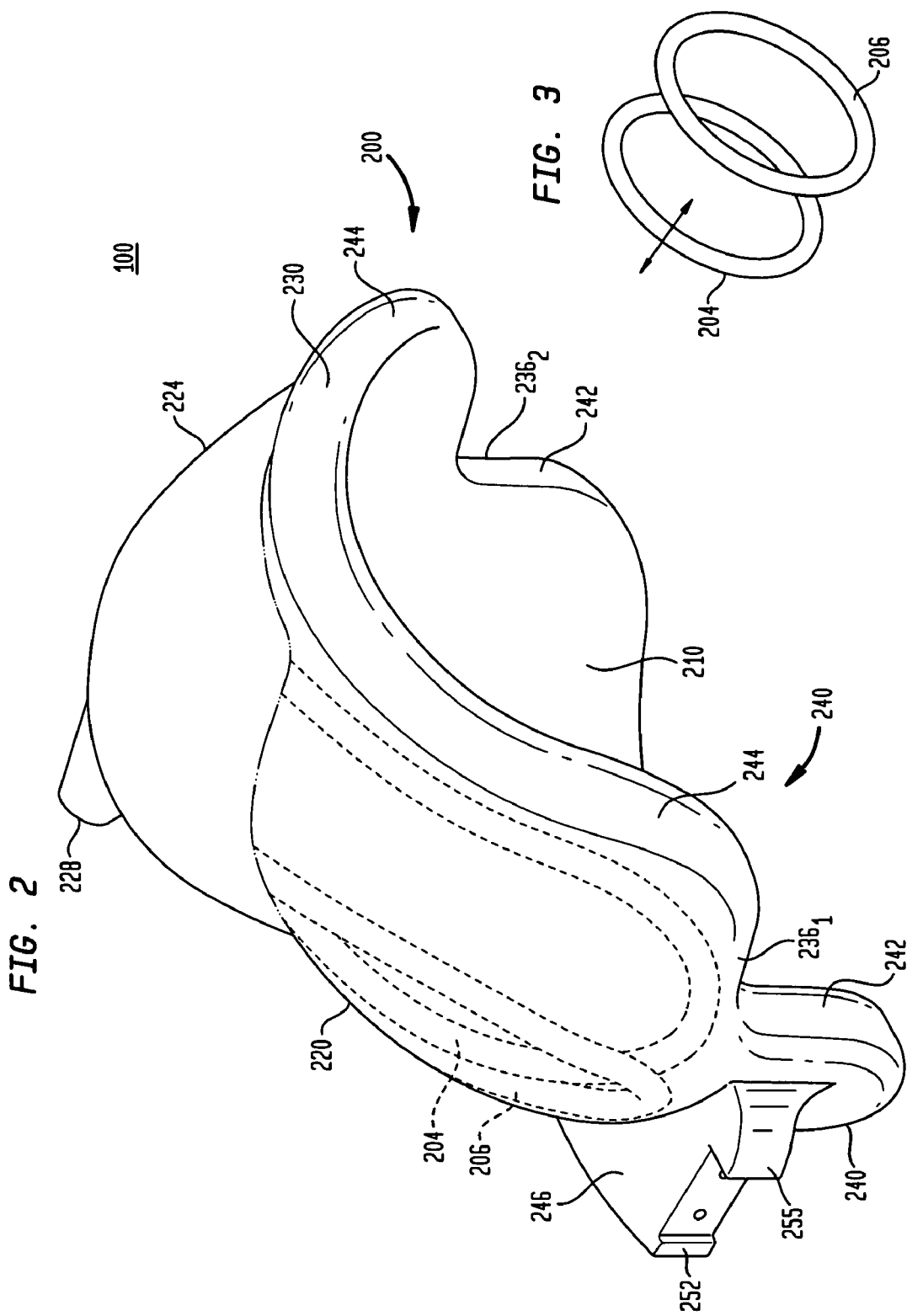

PHASED ARRAY SHOULDER COIL

CROSS-REFERENCE TO RELATED APPLICATIONS

This application claims the benefit of the filing date of U.S. Provisional Patent Application No. 60/764,884, filed Feb. 3, 2006, the disclosure of which is hereby incorporated herein by reference.

BACKGROUND OF THE INVENTION

The present application relates to magnetic resonance imaging (MRI) apparatus and methods for using such apparatus in imaging procedures. In magnetic resonance imaging, an object to be imaged as, for example, a body of a human subject is exposed to a strong, substantially constant static magnetic field. The static magnetic field causes the spin vectors of certain atomic nuclei within the body to randomly rotate or "precess" around an axis parallel to the direction of the static magnetic field. Radio frequency excitation energy is applied to the body, and this energy causes the nuclei to "precess" in phase and in an excited state. As the precessing atomic nuclei relax, weak radio frequency signals are emitted; such radio frequency signals are referred to herein as magnetic resonance signals.

Different tissues produce different signal characteristics. Furthermore, relaxation times are the dominant factor in determining signal strength. In addition, tissues having a high density of certain nuclei will produce stronger signals than tissues with a low density of such nuclei. Relatively small gradients in the magnetic field are superimposed on the static magnetic field at various times during the process so that magnetic resonance signals from different portions of a patient's body differ in phase and/or frequency. If the process is repeated numerous times using different combinations of gradients, the signals from the various repetitions together provide enough information to form a map of signal characteristics versus location within the body. Such a map can be reconstructed by conventional techniques known in the magnetic resonance imaging art, and can be displayed as a pictorial image of the tissues as known in the art.

The magnetic resonance imaging technique offers numerous advantages over other imaging techniques. MRI does not expose either the patient or medical personnel to X-rays and offers important safety advantages. Also, magnetic resonance imaging can obtain images of soft tissues and other features within the body which are not readily visualized using other imaging techniques. Accordingly, magnetic resonance imaging has been widely adopted in the medical and allied arts.

Several factors impose physical constraints in the positioning of patients and ancillary equipment in magnetic resonance imaging. Many MRI magnets use one or more solenoidal superconducting coils to provide the static magnetic field arranged so that the patient is disposed within a small tube running through the center of the magnet. The magnet and tube typically extend along a horizontal axis, so that the long axis or head-to-toe axis of the patient's body must be in a horizontal position during the procedure. Moreover, equipment of this type may provide a claustrophobic environment for the patient. Iron core magnets have been built to provide a more open environment for the patient. These magnets typically have a ferromagnetic frame with a pair of ferromagnetic poles disposed one over the other along a vertical pole axis with a gap between them for receiving the patient. The frame includes ferromagnetic flux return members such as plates or columns extending vertically outside of the patient-receiving gap. A magnetic field is provided by permanent magnets or electromagnetic coils associated with the frame. A magnet of this type can be designed to provide a more open environment for the patient. However, it is still generally required for the patient to lie with his or her long axis horizontal.

Recently, ferromagnetic frame magnets having horizontal pole axes have been developed. As disclosed, for example, in commonly assigned U.S. Pat. Nos. 6,414,490 and 6,677,753, the disclosures of which are incorporated by reference herein, a magnet having poles spaced apart from one another along a horizontal axis provides a horizontally oriented magnetic field within a patient-receiving gap between the poles. Such a magnet can be used with a patient positioning device including elevation and tilt mechanisms to provide extraordinary versatility in patient positioning. For example, where the patient positioning device includes a bed or similar device for supporting the patient in a recumbent position, the bed can be tilted and/or elevated so as to image the patient in essentially any position between a fully standing position and a fully recumbent position, and can be elevated so that essentially any portion of the patient's anatomy is disposed within the gap in an optimum position for imaging. As further disclosed in the aforesaid patents, the patient positioning device may include additional elements such as a platform projecting from the bed to support the patient when the bed is tilted towards a standing orientation. Still other patient supporting devices can be used in place of a bed in a system of this type. For example, a seat may be used to support a patient in a sitting position. Thus, magnets of this type provide extraordinary versatility in imaging.

Another physical constraint on MRI imaging has been posed by the requirements for RF antennas to transmit the RF excitation energy and to receive the magnetic resonance signals from the patient. The antenna that receives the signals is preferably positioned in close proximity to the portion of the patient's body that is to be imaged so as to maximize the signal-to-noise ratio and improve reception of the weak magnetic resonance signals. The antenna that applies RF excitation energy can be positioned in a similar location to maximize efficiency of the applied RF energy. In some cases, the same antenna is used to apply RF excitation energy and to receive the magnetic resonance signals at different times during the process. However, it is often desirable to provide two separate antennas for this purpose.

The antennas are typically formed as one or more loops of electrically conductive material. Such a loop antenna must be positioned so that the conductor constituting the loop extends along an imaginary plane or surface having a normal vector transverse to the direction of the static magnetic field. Stated another way, the antenna must be arranged to transmit or receive electromagnetic fields in a direction perpendicular to the direction of the static magnetic field if it is to interact with the precessing atomic nuclei. This requirement has further limited available antenna configurations and techniques. For example, in a vertical-field magnet such as a ferromagnetic frame magnet having a vertical pole axis, it is impossible to use a loop antenna with the loop disposed generally in a horizontal plane below the body of a recumbent patient. Such an antenna has a normal vector which is vertical and hence parallel to the direction of the static magnetic field. A loop antenna which encircles the patient with its normal vector extending horizontally can be employed. Also, planar or saddle-shaped loops extending in generally vertical planes or surfaces, and having normal vectors in the horizontal direction transverse to the long axis of the patient can be positioned on opposite sides of the patient. However, these antenna configurations do not provide optimum signal-to-noise ratios in some procedures.

The signal-to-noise ratio of the magnetic resonance or NMR signal may be further increased by employing one or more coils arranged to cover a specific anatomical area of interest. In addition, it is also desirable to house these coils in an apparatus that positions as close as possible to region of interest.

SUMMARY OF THE INVENTION

An aspect of the present invention is an antenna assembly for magnetic resonance imaging. The assembly preferably includes a housing having an inner surface, an outer surface and defining an inner annular space. The inner surface is preferably adapted to receive a shoulder of a patient. The assembly further preferably includes a pair of coils arranged within the inner annular space of the housing to form a phased array antenna for receiving resonance signals.

In accordance with this aspect of the present invention, the pair of coils is preferably arranged to partially overlap.

Further in accordance with this aspect of the present invention, a position of at least one of the coils is adjustable relative to the other. The adjustable coil is preferably adjusted to cancel the mutual coupling between the coils making them magnetically independent.

Further still, each of the coils is preferably shaped as an oval, although the coils may be shaped as a ring.

Yet further in accordance with this aspect of the present invention, the inner surface of the coil desirably comprises a concave section adapted to snugly fit over the shoulder of the patient.

In another aspect, the present invention may comprise a magnetic resonance imaging system. The system preferably comprises a magnetic resonance imaging apparatus having a pair of opposed elements spaced apart along a horizontal pole axis and defining a patient-receiving space therebetween; a device for supporting a patient in an upright position in the patient receiving space; and a phased array antenna coil assembly for receiving magnetic resonance signals mounted to the device and adapted to fit over a shoulder of a patient.

In accordance with this aspect of the present invention, the phased array antenna coil assembly comprises a hollow shell housing a first coil and a second coil arranged to partially overlap each other. Most preferably, the first and second coils are oval in shape, although they may also be circular in shape.

Further in accordance with this aspect of the present invention, the magnetic resonance imaging apparatus may comprise a superconducting magnet or a resistive electromagnet.

Further still, the opposed elements are preferably arranged to define a magnetic field volume that defines an imaging volume of the magnetic resonance imaging apparatus and the phased array antenna coil assembly is positionable in the imaging volume of the magnetic resonance imaging apparatus.

In another aspect, the present invention is a method for magnetic resonance imaging. The method preferably comprises providing a magnet having a pair of elements spaced apart along a horizontal magnetic field axis and defining a patient-receiving space therebetween; affixing a phased array antenna coil assembly to a patient support apparatus; adapted to fit over a shoulder of a patient; and positioning the patient on the patient support apparatus such that the phased array shoulder coil fits over the patient's shoulder.

BRIEF DESCRIPTION OF THE DRAWINGS

FIG. 2 depicts a perspective view of a shoulder coil assembly in accordance with an aspect of the present invention.

FIG. 3 illustratively depicts overlapping coils in accordance with an aspect of the present invention.

DETAILED DESCRIPTION

Figure 1:
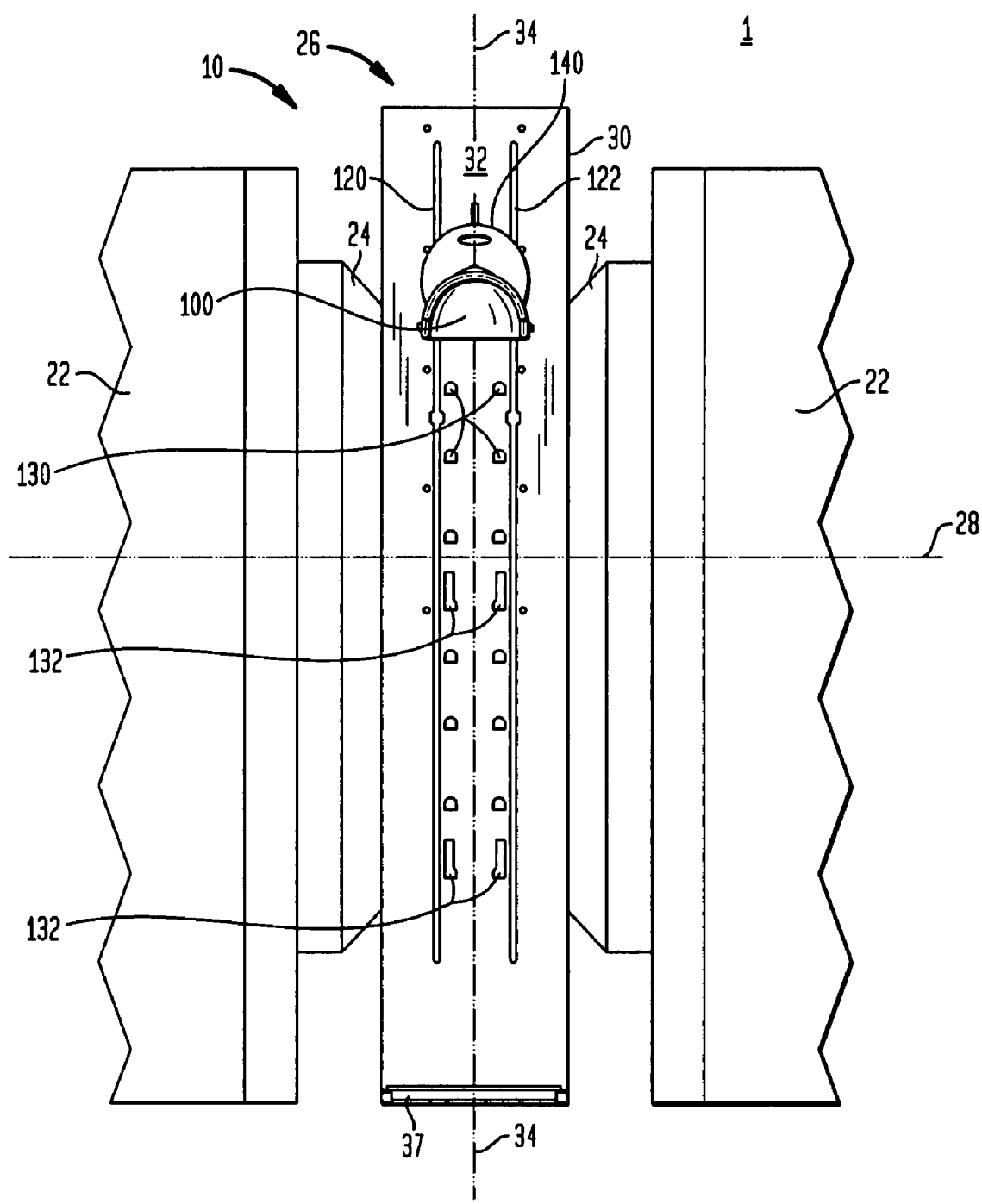
FIG. 1 depicts a front view of magnetic resonance imaging system in accordance with an aspect of the present invention.

FIG. 1 depicts a front view of magnetic resonance imaging system 1 in accordance with an aspect of the present invention. The system 1 includes a magnet resonance imaging apparatus 10, which is generally in accordance with the disclosure of the aforementioned commonly assigned U.S. Pat. Nos. 6,677,753 and 6,414,490, and U.S. application Ser. Nos. 10/427,443, and 10/301,187, the disclosures of which are assigned to the assignee of the present application and hereby incorporated by reference herein. The resonance imaging apparatus 10 includes a magnet 22 comprising a pair of opposed elements 24 defining a patient-receiving space 26 between them. In the particular magnet illustrated, the opposed elements are pole faces. Other types of magnets may also be used and may comprise superconducting or resistive electromagnet coils or other structures. The magnet 22 is arranged to provide a magnetic field surrounding a magnet axis 28 within patient-receiving space 26. The magnet axis 28 as well as the magnetic field axis of the magnet extends in a substantially horizontal direction.

The magnetic resonance imaging apparatus 10 further includes a patient support 30 having a patient support surface 32 and a longitudinal direction 34. The patient support surface 32 lies in a generally vertical plane and the longitudinal direction extends generally vertically. However, it is also possible to rotate the patient support 30 so that the longitudinal direction extends in a substantially horizontal direction, or any direction between horizontal and vertical. The widthwise or lateral dimension of the patient-receiving surface is transverse to the longitudinal direction 34 and parallel to the magnet axis 28. The lateral dimension is slightly less than the dimension of the patient-receiving space 26 between the elements 24. A footrest 37 projects from one end of the patient-receiving surface 32 and is generally used as standing surface.

The patient support 30 is preferably associated with a carriage incorporating a drive unit (not shown) arranged to move the patient support in a direction parallel to its longitudinal direction and, as previously discussed, to rotate the support 30 between the vertical condition illustrated and a horizontal condition (not shown) in which the patient-receiving surface 32 and longitudinal direction 34 are generally horizontal. In accordance with the operational versatility of the apparatus 10, the patient may also be rotated to even a reverse Trendelburg position. In addition, the patient may be raised or lowered. The magnet may also include a rail system for traversing the patient support along a horizontal plane. Additional details with respect to these features of the apparatus 10 are described in the aforementioned patents and patent applications.

Figure 7:
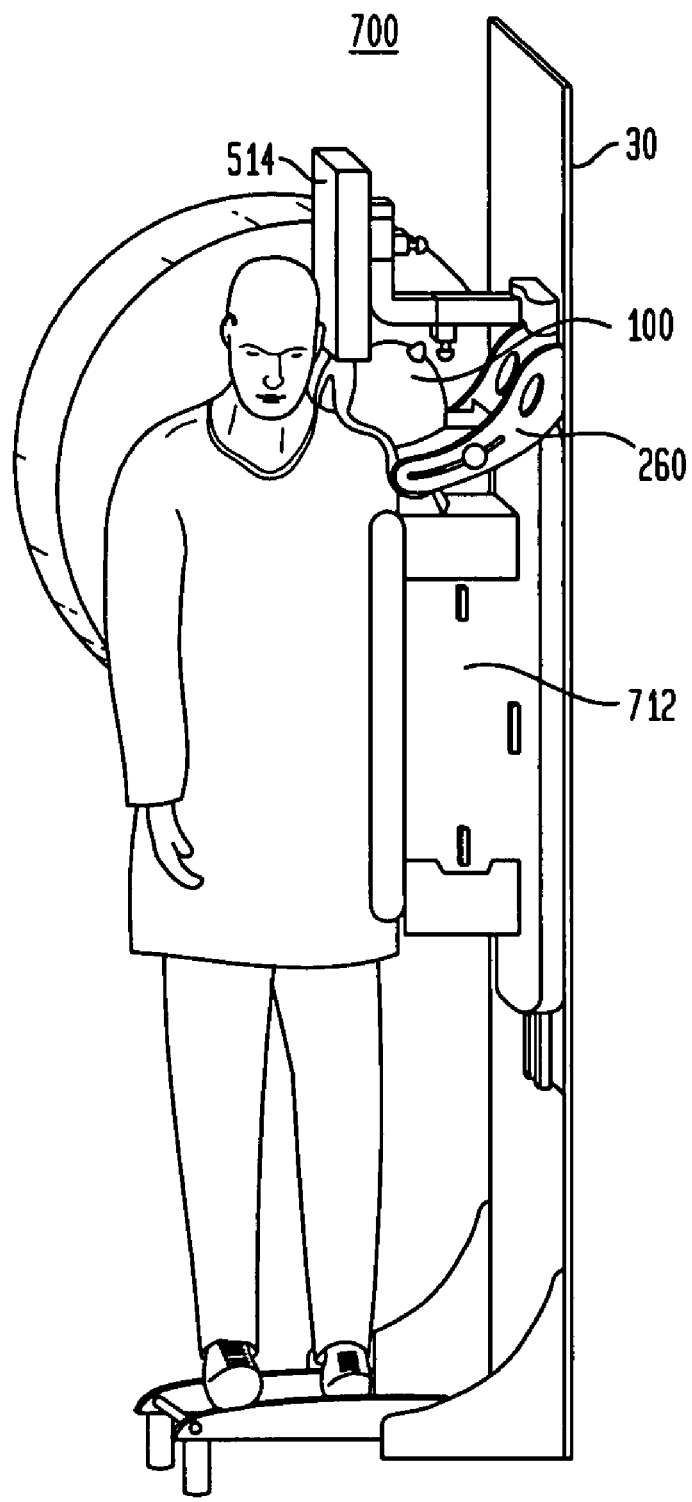
FIG. 7 shows a partial perspective view of a patient being imaged in accordance with an aspect of the present invention.

As is also shown in FIG. 1, the system includes shoulder coil assembly 100 that is affixed to the patient support 30. As best seen in FIG. 7, a patient may be positioned on the support 30 such that a shoulder fits within the shoulder coil assembly 100. The proximity of the patient's shoulder to the coil assembly 100 and the ability to translate the patient support in a direction parallel to the longitudinal axis of the patient allows the shoulder to be positioned within the imaging volume defined by the magnet 22. Although not necessary, it is further desirable to position the patient's shoulder or portion of the patient's anatomy of interest at the center of the imaging volume, i.e., positioned within the magnet's isocenter. In addition to the assembly 100, FIG. 7 also shows additional supports that are used to immobilization the patient and provide additional support when the support 30 is rotated.

Returning to FIG. 1, the patient receiving surface 32 includes a pair of slots 120 and 122 extending parallel to each other in the longitudinal direction 34 of the support 30. As discussed in the '443 application, the slots 120 and 122 are generally T-shaped in cross section. Thus, each slot has a narrow top portion where the slots open to the surface 32 remote from the opening of the slot. Pockets 130 are provided in pairs along the lengths of the slots 120 and 122. These pockets are generally wider than the narrow top portion 128. The surface 32 further includes a pair of rectangular slots 132 disposed opposite each other along the lateral direction of the surface 32. The assembly 100, as is shown in FIG. 1, is mounted to the support 30 via a mounting fixture 140. The mounting fixture 140 is adapted to be mounted to the slots 120, 122 and may be adjustable along the longitudinal direction 34. In other embodiments the assembly 100 may be made to mount directly to the surface 32 of the support 30. In such an embodiment, the assembly 100 may also be slidably mounted to the slots 120, 122.

Turning now to FIG. 2, there is shown a perspective view the assembly 100 in accordance with an aspect of the present invention. The assembly 100 comprises a main housing or hollow shell 200 that includes an inner annular space into which a pair of coils 204, 206 are housed. The main housing 200 also includes an inner surface 210 and an outer surface 220. The main housing 200 is formed such that a portion the inner surface 210 comprises a concave surface or section that is desirably shaped and adapted to receive a shoulder of a human subject (see FIG. 7). As the outer surface 220 and inner surface 210 forms the main housing 200, the outer surface 220 is shaped to match the shape of the inner surface 210.

Attached to a portion of the outer surface 210 is a receptacle 224. The receptacle 224 includes an enclosure for housing preamplifiers or other circuitry associated with the coils housed in the inner annular space of the main housing 200. The receptacle 224 also includes a connector 228 for attaching a cable so that signals received by the coils may be transmitted to equipment associated with the magnetic resonance system and further processed in a known manner to produce magnetic resonance images. Although the receptacle 224 is shown in FIG. 2 as a separate housing, it is also possible form the main housing 200 to include an enclosure for housing the other circuitry associated with the coils.

The housing 200 further includes a top or front edge 230, opposing first and second side edges 236$_1$, and 236$_2$, respectively, and a rear/bottom edge 240. The edges, 230, 236 and 240 form a continuous edge 240 that define the periphery of the housing 200. As shown, the continuous edge 240 is preferably rounded. In the preferred embodiment, each of the side edges are contoured to include a substantially horizontal section that runs into a substantially vertical section preferably contoured to match a patient's anatomy near the shoulder upper arm region. As shown in FIG. 2, the side sections extend between points 242 and 244. During imaging (see FIG. 7) the front edge 230 is proximate the patient's neck with one side edge on the anterior side of the patient, while the other side edge is on the posterior side of the patient. Therefore, each side 236 saddles the patient's shoulder region. As is also shown, during imaging the bottom edge is located proximate the patient's upper arm.

A mount 246 projects from the outer surface 220 proximate the bottom edge 240. The mount 246 provides an interface to a fixture mounting apparatus 260, which is described in further detail below and attaches to the slots 120, 122 on the patient receiving surface 32. The mount 246 substantially comprises a rectangular block that includes a pair of detents 252 on opposite sides (only one shown). A ledge 255 is formed opposite each detent 252 and projects from the outer surface 220 as shown. The mount 246 slides into a slot (see FIG. 5, slot 530) on the fixture mounting apparatus 260 and is held in place by the fixture mounting apparatus.

As is also shown in FIG. 2, the coils 204, 206 are oval-shape and overlap each other to form a phased array coil antenna. Although the coils are shown with the longer sides of the oval extending substantially parallel to the front edge 230, the coils may also be laid out so that the longer sides extend in the other directions. In addition, the coil may be circular, although the oval shape may be preferred for the shoulder region.

For clarity, the overlap is shown in FIG. 3. In addition, as illustrated in FIG. 3, one of coils is adjustable relative to each other. This allows the coils to be adjusted, i.e., positioned, to achieve proper overlap so that the mutual inductance point between the coils is substantially 0 or at a minimum inductance point. The coils are arranged to efficiently cover the anatomical region of interest, i.e., the shoulder region, and allow a higher-resolution, higher SNR signal to be obtained over a larger volume. Thus, this arrangement of the coils and their placement proximate a patient's shoulder region allows for enhanced images to be taken of the shoulder region.

Figure 4A:
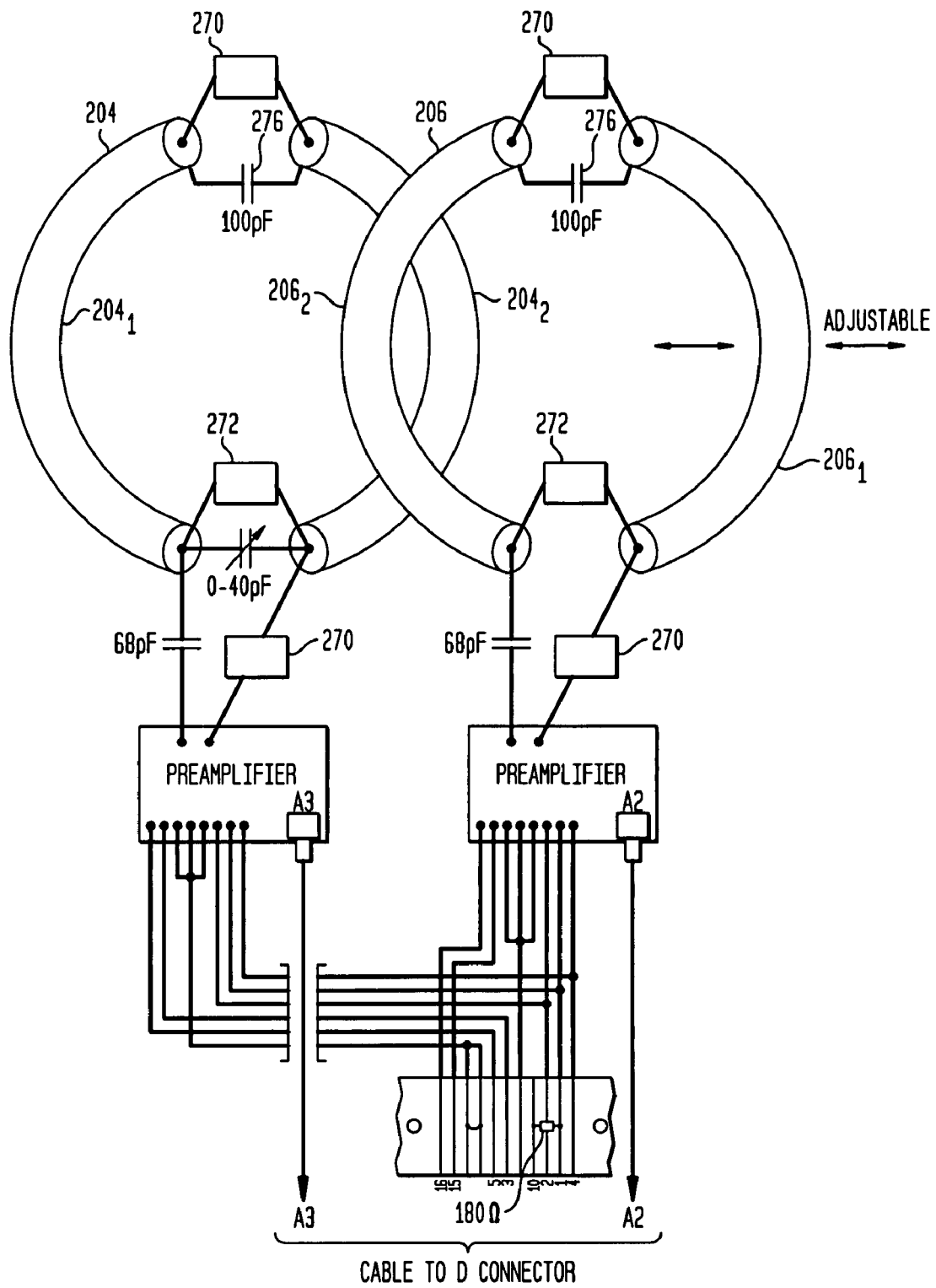
FIG. 4A depicts an electric circuit diagram of phased array coils in accordance with an aspect of the present invention.

Turning now to FIG. 4A, there is shown an electric circuit diagram of the phased array coils in accordance with an aspect of the present invention. As shown, each coil includes two sections 204$_1$, 204$_2$, and 206$_1$, 206$_2$. The sections are coupled together through decoupling circuits 270, 272 and capacitors 276. Each of the decoupling circuits 270 preferably includes a 330 pF capacitor. The signals detected by each coil 204, 206 is then fed to respective preamplifiers 278 and to the connector 228 (see FIG. 2) via a cable or other suitable means. Although FIG. 4 is implemented using the specific circuit elements and associated values, one skilled in the art would appreciate that the circuit elements may be arranged in a different manner and have different values yet while operating as described.

Figure 4B:
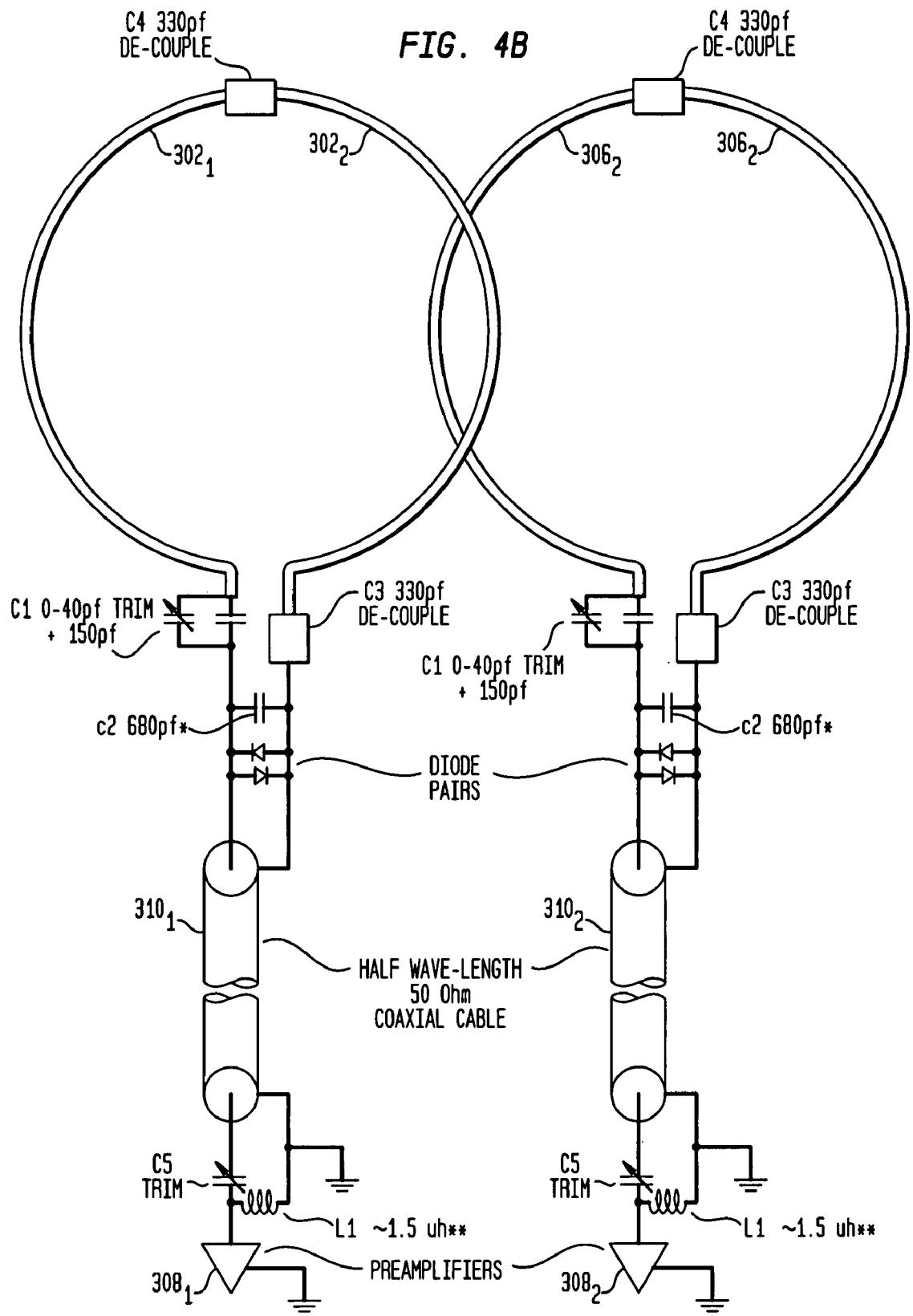
FIG. 4B depicts an electric circuit diagram of phased array coils in accordance with an aspect of the present invention.

FIG. 4B depicts a circuit diagram of a phased array coil arrangement in accordance with another aspect of the present invention. In this alternate arrangement, each coil includes two sections, 302$_1$, 302$_2$ and 306$_1$, 306$_2$. The respective sections are connected together through circuit elements C4, which each preferably includes a 330 pF capacitor. The circuit elements C4 are operable to isolate the signal carrying circuits. As is shown, the circuit also includes other decoupling circuit elements C3. In addition, each coil is coupled to pre-amplifiers 308 through a half-wavelength 50 ohm coaxial cable 310 or other low impedance cable. Each of the cables 310 is connected to the coils via the arrangement of capacitors and diodes as shown. The capacitor C2 is adjusted for 50 ohms at resonance with nominal load. The C5 trim cap and L1 are adjusted for series resonance at frequency of interest.

Figure 5:
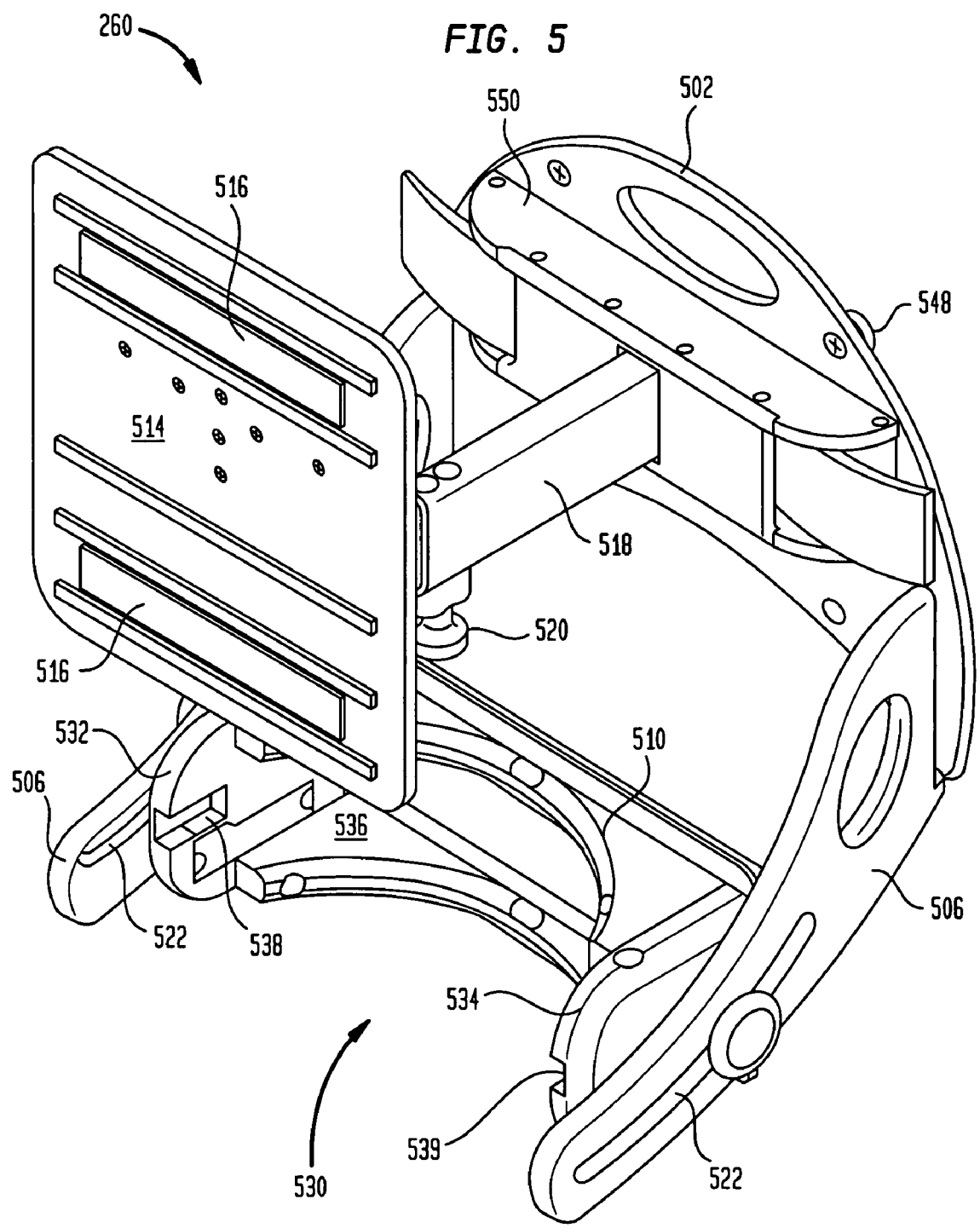
FIG. 5 depicts a fixture mounting apparatus in accordance with an aspect of the present invention.

Turning now to FIG. 5, there is shown a fixture mounting apparatus 260 that is preferably used to mount the phased array shoulder coil assembly 200 to the patient support device or apparatus 30. As discussed above and shown in FIG. 7, during imaging the patient P will typically stand sideways in the patient receiving space of the magnet. In addition, in one embodiment the patient support device may be rotated so that the patient goes from a standing upright position to a horizontal or recumbent position. In the recumbent position, the patient's feet and head will need to be supported in order to avoid patient discomfort and movement. The fixture mounting apparatus 260 provides support for the head of a patient.

Figure 6:
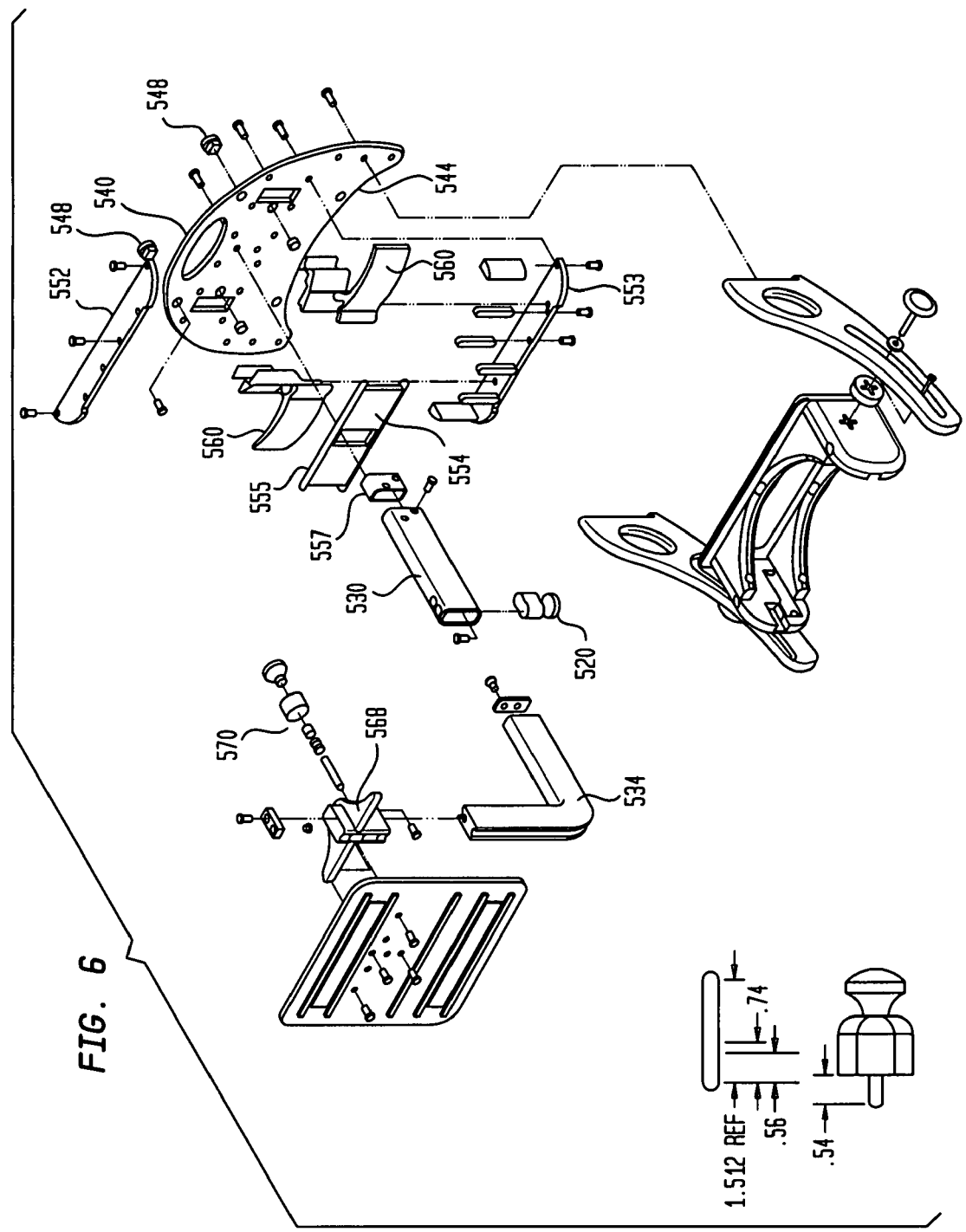
FIG. 6 illustrates an assembly diagram of the fixture mounting apparatus of FIG. 5.

In particular, the fixture mounting apparatus 260 includes a base plate 502, a pair of sidewall members 506, a support cross-section 510 and a headrest 514. The headrest 514 is connected to the base plate 502 via an adjustable arm 518. As best seen in FIG. 6, the arm includes a sleeve 530 and an L-shaped arm 534. The L-shaped arm 534 mounts into the sleeve 532 and is attached to the headrest 514. The adjustable arm 518 includes a locking knob 520 for locking the headrest 514 in place. The headrest 514 is substantially rectangular in shape and preferably includes a pair of Velcro strips 516 for attaching cushioning (not shown). The cross-section support member 510 is mounted between the sidewalls 506 via slots 522 to allow for adjustment toward and away from the base plate 502. The support cross-section 510 is gusseted to accommodate a shoulder of a patient.

The apparatus 260 also includes a slot 530 for receiving mount 246 and the shoulder coil assembly 100. The slot is defined by the support cross section 510, sidewalls 532, 534 and another support cross section 536. As the mount 246 into the slot 530, the ledges 255 engage the grooves 538, 539. When the mount 246 is fully inserted in slot 530, the front walls of the ledges forms an adjacent or opposing surface to the back wall of the grooves 538, 539.

Turning now to FIG. 6, there is shown a diagram illustrating the assembly of the support member 260. As shown, the base 502 comprises a planar base plate 540 that includes a circular outer edge 542 that terminates at a diametric cross section 544 that includes an arcuate run. The base plate includes a number of screw holes that are used to attach knobs 548 and compartment 550. The knobs 548 are used to attach the support member 260 to patient support device or apparatus 30 and are preferably adapted to be inserted in slots 120, 122.

The compartment 550 includes top, bottom and front walls 552, 553, and 554. The front wall is attached to the top and bottom walls using fasteners that are mounted through the top and bottom walls and secured in screw holes located along the top and bottom edges of the front wall. The top and bottom walls 552, 553 are screwed to the base plate through the appropriate screw holes as shown. The front wall 554 includes an opening 555 for receiving the sleeve 530 of the adjustable arm 518. The sleeve 530 is inserted through the opening 555 onto a mounting stud 557 and fastened to the mounting stud 557. The stud 557 is fastened to the base plate 540.

The L-shaped arm 534 is fastened to the headrest 1014 using mounting head 568. The mounting head 1068 is preferably mounted to the L-shaped arm 534 using a locking mechanism 1070 as shown. The side walls 506 are preferably mounted to the support cross-section 510 using a locking mechanism as shown and discussed in commonly assigned U.S. patent application Ser. No. 11/227,817, the disclosure of which is incorporated herein by reference.

FIG. 7 shows a partial perspective view of a patient being imaged in a fully assembled system 700. As shown, the patient is shown standing with an arm inserted in an immobilizing fixture 712. As discussed in the '817 application, the fixture 712 immobilizes the patient during imaging. In addition, the patient may be supported at the legs or other areas for rotation. The patient's head is resting against head rest 514. As shown, the head rest 514 is equipped with a pad that provides a resting surface for the patient's head. A shoulder coil assembly 200 is attached to the fixture adjacent the patient's shoulder. With the patient supported in this way, the patient support 30 may be rotated about polar axis 28 (see FIG. 1). In addition, the patient may be raised, or lowered as shown, so that the shoulder coil assembly 280 is positioned in the imaging volume of the magnet. This coupled with the phased array coil arrangement housed within the coil assembly 280 and the proximity of the coil assembly 280 to the shoulder region allows for improvement in imaging this region of a patient. In addition, although FIG. 7 shows the patient being imaged in a standing position, the patient's shoulder region may also be imaged with the patient being seated.

Although FIG. 7 shows the patient in an upright position and being supported and immobilized by immobilizing fixture 712, images of the shoulder may be taken without the fixture mounting apparatus 260 and the fixture 712. For example, the assembly 100 may be connected to the patient support 30 without the aid of a mounting fixture. In such an embodiment, the assembly may be made to mount directly to elongated slots 120, 122, pockets 130 or slots 130. This may additional flexibility in positioning the patient and rotating the patient support. Note, however, that immobilization further enhances the imaging process by reducing the chances of motion artifacts in the images.

In another embodiment, the assembly 100 may be mounted to the patient support 30 using a different mounting fixture than shown in FIG. 5. For example, and as described in the '443 application, the fixture may be mounted using a universal fixture in combination with a mounting unit.

Figure 8:
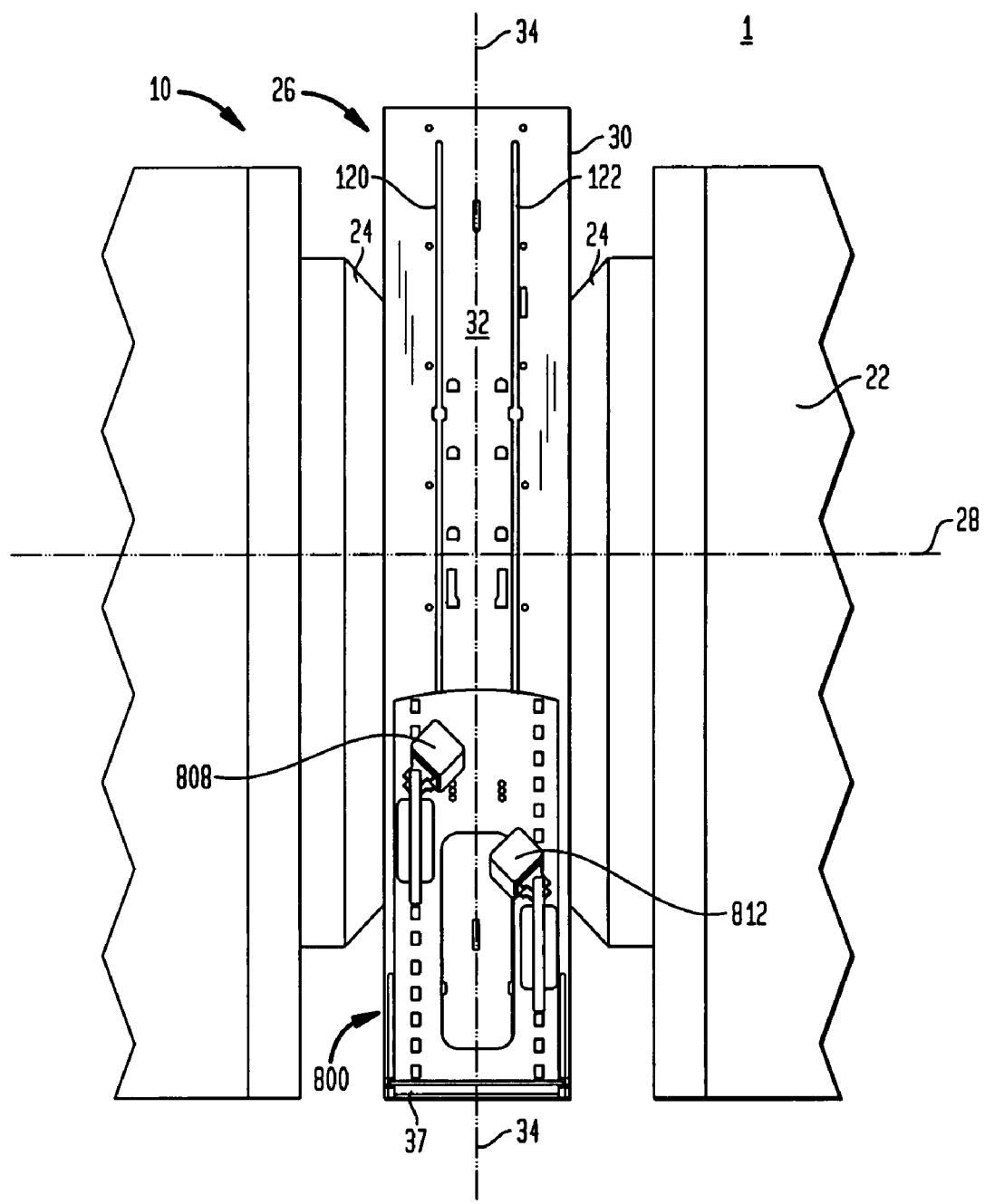
FIG. 8 depicts a front view of magnetic resonance imaging system in accordance with an aspect of the present invention.

In addition, although the patient has been generally described above and shown as being in a standing position in FIG. 7, the patient may also be imaged in a sitting position on seat attached to the bed. In another embodiment, the patient may be positioned in kneeling position on the support apparatus 800, as shown in FIG. 8, with his/her shoulder positioned in the assembly 100. The apparatus 800 includes a buttocks support 808 and a knee support 812 and is further described in U.S. patent application Ser. No. 10/756,576, the disclosure of which is incorporated by reference herein.

As described above, the patient may be imaged in a substantially upright position, including a standing and position. It is also possible to image the patient's shoulder using the assembly 100 with the support apparatus 30 tilted off its vertical axis at any position between upright vertical and recumbent horizontal positions. It sometimes desirable to tilt the patient support at an angle of approximately 30 degrees off vertical and image the shoulder using the assembly 100.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An antenna assembly for magnetic resonance imaging, comprising:
   a housing having an inner surface, an outer surface and defining an inner annular space, the inner surface being adapted to fit over a shoulder of a patient; and
   a pair of coils arranged within the inner annular space of the housing to form a phased array antenna for receiving resonance signals.

2. The antenna assembly of claim 1, wherein the pair of coils are arranged to partially overlap.

3. The antenna assembly of claim 1, wherein a position of at least one of the coils is adjustable relative to the other.

4. The antenna assembly of claim 3, wherein the adjustable coil is adjusted to substantially cancel mutual inductance in the phase array antenna.

5. The antenna assembly of claim 1, wherein each of the coils is shaped as an oval.

6. The antenna assembly of claim 1, wherein each of the coils is shaped as a ring.

7. The antenna assembly of claim 1, wherein the inner surface comprises a concave section adapted to snugly fit over the shoulder of the patient.

8. A magnetic resonance imaging system, comprising:
   a magnetic resonance imaging apparatus having a pair of opposed elements spaced apart along a horizontal pole axis and defining a patient-receiving space therebetween;
   a device for supporting a patient in the patient receiving space; and
   a phased array antenna coil assembly for receiving magnetic resonance signals mounted to the device and adapted to fit over a shoulder of a patient.

9. The system of claim 8, wherein the phased array antenna coil assembly comprises a hollow shell housing a first coil and a second coil arranged to partially overlap each other.

10. The system of claim 9, wherein the first and second coils are oval in shape.

11. The system of claim 9, wherein the first and second coils are circular in shape.

12. The system of claim 8, wherein the magnetic resonance imaging apparatus comprises a superconducting magnet.

13. The system of claim 8, wherein the magnetic resonance imaging apparatus comprises a resistive electromagnet.

14. The system of claim 8, wherein the opposed elements are arranged to define a magnetic field volume associated with the magnetic resonance imaging apparatus and the phased array antenna coil assembly is positionable in the imaging volume of the magnetic resonance imaging apparatus.

15. The system of claim 14, wherein the device is adjustable along a direction parallel to a longitudinal axis of a patient supported by the device so as to position the phased array antenna coil assembly in the imaging volume of the magnetic resonance imaging apparatus.

16. A method for imaging a patient in a magnetic resonance imaging magnet, comprising:
   providing a magnet having a pair of elements spaced apart along a horizontal magnetic field axis and defining a patient-receiving space therebetween;
   affixing a phased array antenna coil assembly to a patient support apparatus; and
   positioning the patient on the patient support apparatus such that the phased array shoulder coil fits over the patient's shoulder.

17. The method of claim 16 further comprising:
   establishing a substantially horizontal static magnetic field between the elements;
   eliciting magnetic resonance signals by transmitting radio frequency energy to the shoulder of the patient; and
   receiving the magnetic resonance signals at the phased array antenna coil.

18. The method of claim 16, further comprising positioning the patient in a substantially upright position.

19. The method of claim 18, further comprising positioning the patient in a sitting position.

20. The method of claim 18, further comprising positioning the patient in a kneeling position.

21. The method of claim 18, further comprising positioning the patient in a standing position.

22. The method of claim 16, further comprising positioning the patient in a recumbent position.

23. The method of claim 16, wherein positioning further comprises titling the patient support apparatus 30 degrees off vertical.

* * * * *